US009465282B2

(12) United States Patent
Wang et al.

(10) Patent No.: US 9,465,282 B2
(45) Date of Patent: Oct. 11, 2016

(54) OPTICAL PROJECTING APPARATUS HAVING TWO DIGITAL MICRO-MIRROR DEVICES

(71) Applicant: DELTA ELECTRONICS, INC., Taoyuan County (TW)

(72) Inventors: Bor Wang, Taoyuan County (TW); Ming-Yo Hsu, Taoyuan County (TW)

(73) Assignee: DELTA ELECTRONICS, INC. (TW)

( * ) Notice: Subject to any disclaimer, the term of this patent is extended or adjusted under 35 U.S.C. 154(b) by 92 days.

(21) Appl. No.: 14/514,935

(22) Filed: Oct. 15, 2014

(65) Prior Publication Data

US 2015/0195498 A1 Jul. 9, 2015

(30) Foreign Application Priority Data

Jan. 3, 2014 (TW) .............................. 103100212 A

(51) Int. Cl.
| | |
|---|---|
| *G03B 21/28* | (2006.01) |
| *H04N 9/31* | (2006.01) |
| *B81B 5/00* | (2006.01) |
| *G03B 21/20* | (2006.01) |
| *G02B 27/14* | (2006.01) |
| *G02B 5/04* | (2006.01) |

(52) U.S. Cl.
CPC .................. *G03B 21/28* (2013.01); *B81B 5/00* (2013.01); *G03B 21/2066* (2013.01); *H04N 9/3155* (2013.01); *H04N 9/3158* (2013.01); *H04N 9/3161* (2013.01); *H04N 9/3182* (2013.01); *B81B 2201/042* (2013.01); *G02B 5/04* (2013.01); *G02B 27/14* (2013.01)

(58) Field of Classification Search
CPC B81B 5/00; B81B 2201/042; H04N 9/3155; H04N 9/3158; H04N 9/3161; H04N 9/3182; H04N 9/3164; H04N 5/7458; G02B 27/14; G02B 5/04
See application file for complete search history.

(56) References Cited

U.S. PATENT DOCUMENTS

| 8,960,924 B2 | 2/2015 | Su et al. |
|---|---|---|
| 9,057,940 B2 | 6/2015 | Chen et al. |
| 2005/0264706 A1 | 12/2005 | Jeon |

(Continued)

FOREIGN PATENT DOCUMENTS

| CN | 202486490 | 10/2012 |
|---|---|---|
| CN | 103376634 | 10/2013 |
| TW | 201316112 | 4/2013 |

OTHER PUBLICATIONS

Office Action dated Dec. 25, 2014 from corresponding No. TW 103100212.

*Primary Examiner* — Sultan Chowdhury
*Assistant Examiner* — Magda Cruz
(74) *Attorney, Agent, or Firm* — Hauptman Ham, LLP

(57) ABSTRACT

An optical projecting apparatus is used for providing a projecting light to a screen via a projecting lens, the optical projecting apparatus and the projecting lens collectively form an optical projecting system. The optical projecting apparatus includes a first solid state light generator generating a first light beam, a second solid state light generator generating a second light beam, a first wavelength-converting module, and a spatial light modulating module. The first wavelength-converting module converts the first light beam into a wavelength-converted light. The spatial light modulating module splits the wavelength-converted light into a third light beam and a fourth light beam, and transmits the second light beam, the third light beam, and the fourth light beam to the screen via the projecting lens.

15 Claims, 9 Drawing Sheets

(56) References Cited

U.S. PATENT DOCUMENTS

2010/0328628 A1* 12/2010 Masuda ............... G02B 26/008
 353/85

2013/0242534 A1* 9/2013 Pettitt .................. G03B 21/204
 362/84

2014/0347634 A1* 11/2014 Bommerbach ...... H04N 9/3158
 353/31

* cited by examiner

OPTICAL PROJECTING APPARATUS HAVING TWO DIGITAL MICRO-MIRROR DEVICES

BACKGROUND OF THE INVENTION

1. Field of the Invention

The present invention relates to an optical projecting apparatus, and in particular to an optical projecting apparatus assembled by two digital micro-mirror devices (DMDs) and at least one solid state light sources.

2. Description of Related Art

Projector having light source consisted of laser and fluorescent material becomes popular. However, laser is expansive so that most of projectors having light source mentioned above adopt one chip digital light processing (DLP) technology to reduce cost.

Projector using one chip DLP technology includes only one digital micro-mirror device (DMD) to modulate image, so that a color wheel must be adopted to generate spectrums having various colors. For example, white spectrum generally composed of red spectrum, green spectrum, and blue spectrum. The spectrums are then serially transmitted to the DMD and modulated thereby, and then observers can sight colors corresponding to the spectrums created by persistence of vision.

The projector using one chip DLP technology mentioned above is compact and cheap because the projector includes only one DMD. However, the projector using one chip DLP technology can't meet requirement of luminance and color saturation. The projector using one chip DLP technology is limited to serial color modulation, so that luminance efficiency thereof is decreased. In order to compensate luminance efficiency, secondary color is applied to the projector mentioned above, however color saturation thereof is then decreased.

Besides, color breaking is brought by mechanical structure limitation of the color wheel. Namely, in some states, observer shall sight unpredictable scrambled color because serial color modulation can't meet condition of persistence of vision, so that the projector mentioned above can't satisfy with high-level application.

At present, projector using one chip DLP technology is replaced by that using three chips DLP technology to overcome color breaking and low luminance efficiency. Projector using three chips DLP technology includes three digital micro-mirror devices (DMDs) so that the single light source with white spectrum can be split into red spectrum, green spectrum, and blue spectrum by beam splitter(s). In the same time, the red spectrum, the green spectrum, and the blue spectrum are transmitted to the DMDs and processed thereby, so that problems of color breaking and low luminous efficiency can be overcome. However, the projector having three DMDs and peripheral optical component corresponding to the each DMD is bulky and its manufacturing cost is then increased.

SUMMARY OF THE INVENTION

It is an aspect to provide an optical projecting apparatus, the optical projecting apparatus assembled by two digital micro-mirror devices (DMDs) and at least one solid state light sources, which can meet requirements of luminance efficiency, color brilliance, and cost.

Accordingly, the optical projecting apparatus used for projecting a light beam to a screen via a projecting lens, the optical projecting apparatus and the projecting lens collectively form an optical projecting system. The optical projecting apparatus comprises a first solid state light generator, a second solid state light generator, an optical module, a first wavelength-converting module, a first color-splitting filter, a second color-splitting filter, and a spatial light modulating module. The first solid state light generator generates a first light beam, the second solid state light generator generates a second light beam. The optical module is arranged between the first solid state light generator, the second solid state light generator, and the projecting lens. The first wavelength-converting module is arranged between the first solid state light generator and the optical module, wherein the first light beam is converted by the first wavelength-converting module to generate a wavelength-converted light beam. The first color-splitting filter reflects the wavelength-converted light and passes the first light beam through. The second color-splitting filter reflects the second light beam and passes the wavelength-converted light beam through. The spatial light modulating module is arranged between the optical module and the projecting lens, the spatial light modulating module splits the wavelength-converted light into a third light beam and a fourth light beam, and then the second light beam, the third light beam, and the fourth light beam are transmitted to the screen via the projecting lens.

The present invention provides another optical projecting apparatus used for projecting a light beam to a screen via a projecting lens. The optical projecting apparatus and the projecting lens collectively forming an optical projecting system, the optical projecting apparatus comprises a solid state light generator, an optical module, a wavelength-converting module, a first color-splitting filter, a second color-splitting filter, a first reflector, a second reflector, and a spatial light modulating module. The solid state light generator generates a light beam. The optical module is arranged between the solid state light generator and the projecting lens. The wavelength-converting module is arranged between the solid state light generator and the optical module, the light beam generated from the solid state light generator is converted by the wavelength-converting module to generate a wavelength-converted light beam. The wavelength-converting module comprises a carrying component, a wavelength-converting layer and a rotating component, the carrying component has an opening, the wavelength-converting layer partially covers the carrying component, the rotating component is connected to the carrying component for rotating the carrying component. The first color-splitting filter reflects the wavelength-converted light and passes the light beam generated from the solid state light generator through. The second color-splitting filter reflects the light beam generated from the solid state light generator and passes the wavelength-converted light beam through. The first reflector is arranged behind the wavelength-converting module, and the second reflector is arranged between the first reflector and the second color-splitting filter. The spatial light modulating module is arranged between the optical module and the projecting lens, the spatial light modulating module splits the wavelength-converted light into a first light beam and a second light beam, and transmitting the light beam generated from the solid state light generator, the first light beam, and the second light beam to the screen via the projecting lens.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

A preferred embodiment of the present invention will be described with reference to the drawings.

Figure 1:
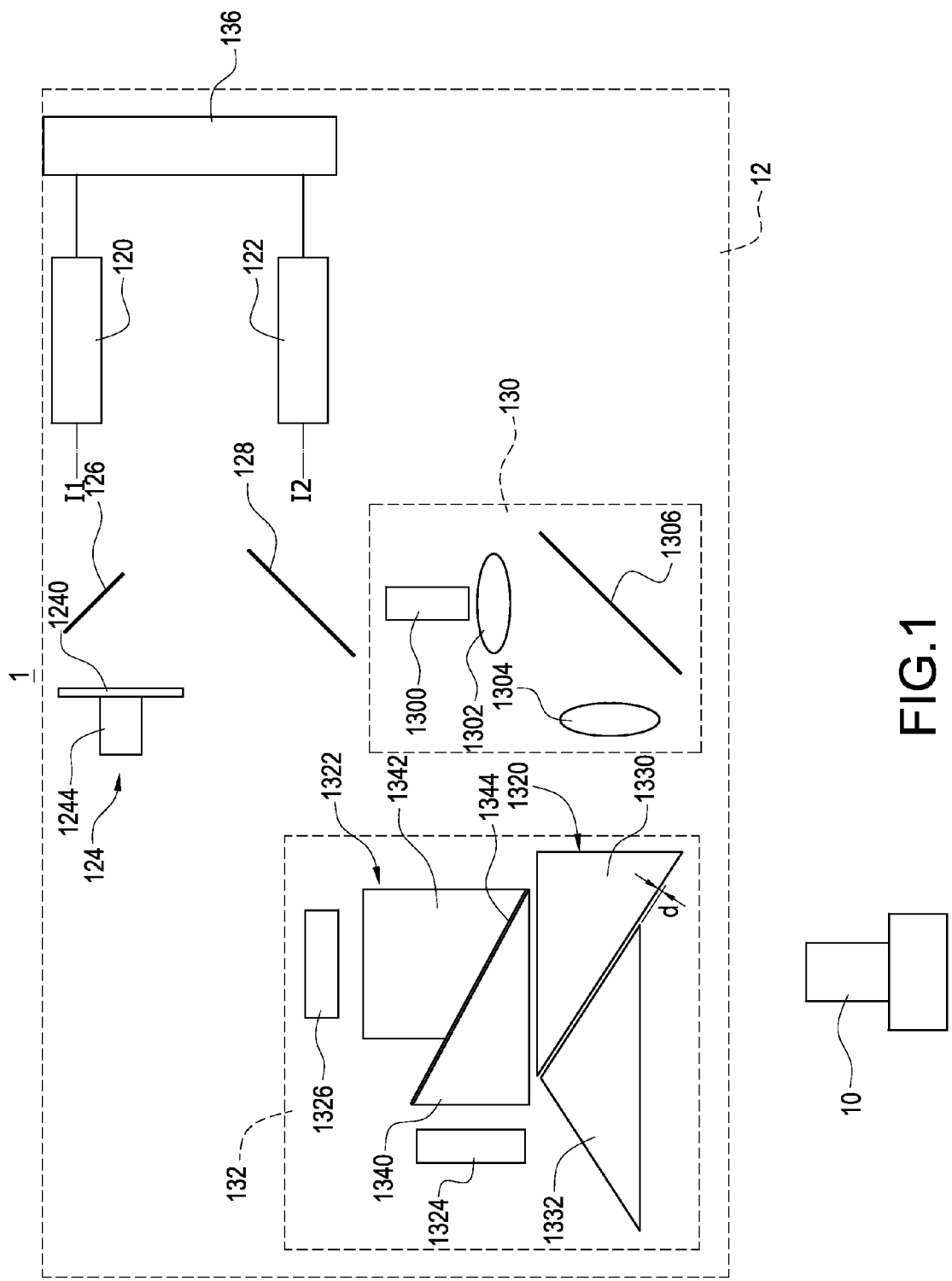
FIG. 1 is a schematic diagram of an optical projecting system according to a first embodiment of the present invention.

Reference is made to FIG. 1, which is a schematic diagram of an optical projecting system according to a first embodiment of the present invention. The optical projecting system 1 includes a projecting lens 10 and an optical projecting apparatus 12. The optical projecting apparatus 12 projects a light beam to a screen (not shown) via the projecting lens 10.

The optical projecting apparatus 12 includes a first solid state light generator 120, a second solid state light generator 122, a first wavelength-converting module 124, a first color-splitting filter 126, a second color-splitting filter 128, an optical module 130, a spatial light modulating module 132, and a controller 136.

The first solid state light generator 120 generates a first light beam and has a first optical axis H. The first optical axis I1 is a symmetrical axis for illuminant intensity of the first light beam in spatial distribution. In this embodiment, the first light beam generated by the first solid state light generator 120 has a blue spectrum. However, in the practical applications, the first light beam is not limited to have blue spectrum. The first solid state light generator 120 is a laser generator.

The second solid state light generator 122 generates a second light beam and has a second optical axis I2. The second optical axis I2 is a symmetrical axis for illuminant intensity of the second light beam in spatial distribution. In this embodiment, the second optical axis I2 of the second solid state light generator 122 is substantially parallel to the first optical axis I1 of the first solid state light generator 120, and the first solid state light generator 120 and the second solid state light generator 122 emit light toward the same direction. However, in the practical applications, the second optical axis I2 of the second solid state light generator 122 can be perpendicular to the first optical axis I1 of the first solid state light generator 120, or an included angle can be formed between the first optical axis I1 and the second optical axis I2. Besides, the second light beam generated by the second solid state light generator 122 is a blue light beam (namely, the second light beam has a blue spectrum) and the spectrum of the second light beam is the same as that of the first light beam. However, in the particular applications, the second light beam is not limited to have the blue spectrum. In the other words, the spectrum of the second light beam can be different from that of the first light beam. The second solid state light generator is a laser generator.

Figure 2:
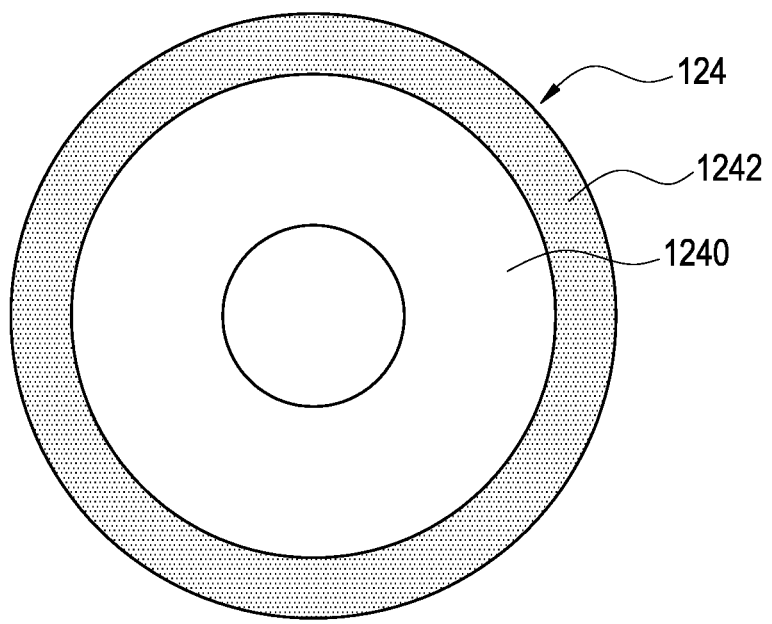
FIG. 2 is a top view of a first wavelength-converting module according to the first embodiment of the present invention.

The first wavelength-converting module 124 is arranged between the first solid state light generator 120 and the projecting lens 10. The first wavelength-converting module 124 includes a carrying component 1240, a wavelength-converting layer 1242, and a rotating component 1244. The carrying component 1240 is made of metal, such as aluminum, which can rapidly conduct heat incurred by the first light beam. However, the carrying component 1240 can be made of other material, such as glass. In this embodiment, a profile of the carrying component 1240 is substantially circular ring, as shown in FIG. 2.

The wavelength-converting layer 1242 is coated on a surface of the carrying component 1240 and facing the first solid state light generator 120. In particularly, the wavelength-converting layer 1242 is coated on the edge of the carrying component 1240 in ring shape. The first light beam is converted by the wavelength-converting layer 1242 to generate a wavelength-converted light beam, and in this embodiment, the wavelength-converted light beam has a yellow spectrum.

The first color-splitting filter 126 is arranged between the first solid state light generator 120 and the first wavelength-converting module 124. The first color-splitting filter 126 passes a light beam with a particular wavelength (or spectrum) through and reflects another light beam with another particular wavelength (or spectrum). In this embodiment, the first color-splitting filter 126 reflects the wavelength-converted light beam and passes the first light beam passing through. According to the description mentioned above, the first light beam generated by the first solid state light generator 120 passes through the first color-splitting filter 126, the wavelength-converted light beam generated by the first solid state light generator 120 and wavelength-converted by the wavelength-converting layer 1242 is reflected by the first color-splitting filter 126, and then the wavelength-converted light is transmitted toward the projecting lens 10.

With referred again to FIG. 1, the second color-splitting filter 128 is arranged between the second solid state light generator 122 and the projecting lens 10, and located within a transmitting route of the wavelength-converted light beam. The second color-splitting filter 128 passes a light beam having particular wavelength (or spectrum) through and reflects another light beam having another wavelength (or spectrum). In this embodiment, the second color-splitting filter 128 reflects the second light beam and passes the wavelength-converted light beam through. Accordingly, the second light beam generated by the second solid state light generator 122 is reflected by the second color-splitting filter 128, and the wavelength-converted light beam passes through the second color-splitting filter 128.

The optical module 130 is arranged between the second color-splitting filter 128 and the projecting lens 10. The optical module 130 includes a light passageway component 1300, a first lens 1302, a second lens 1304, and a mirror 1306. The light passageway component 1300 is close to the second color-splitting filter 128 and can be light-guide tube or rod lens.

The first lens 1302 is arranged between the light passageway component 1300 and the projecting lens 10. The second lens 1304 is arranged between the first lens 1302 and the projecting lens 10. The mirror 1306 is arranged between the first lens 1302 and the second lens 1304. The optical module 130 transmits the wavelength-converted light beam generated by the first solid state light generator 120 and wavelength-converted by the wavelength-converting module 124 and the second light beam generated by the second solid state light generator 122 to the spatial light modulating module 132.

The spatial light modulating module 132 is arranged between the optical module 130 and the projecting lens 10. The spatial light modulating module 132 includes a total-internal-reflecting prism 1320, a color-splitting prism 1322, a first spatial light modulator 1324, and a second spatial light modulator 1326.

The total-internal-reflecting prism 1320 total-internal-reflects the wavelength-converted light beam and the second light beam so that the wavelength-converted light beam and the second light beam are transmitted to the color-splitting prism 1322.

The color-splitting prism 1322 includes a first color-splitting part 1340, a second color-splitting part 1342, and a color-splitting layer 1344. The first color-splitting part 1340 is close to the total-internal-reflecting prism 1320, the second color-splitting part 1342 is far away from the total-internal-reflecting prism 1320. The color-splitting layer 1344 is arranged between the first color-splitting part 1340 and the second color-splitting part 1342, and splits the wavelength-converted light beam into a third light beam and a fourth light beam. The color-splitting layer 1344 passes the third light beam having red spectrum through and reflects the fourth light beam having green spectrum. The fourth light beam reflected by the color-splitting layer 1344 is transmitted to the first spatial light modulator 1324, and the third light beam passing through the color-splitting layer 1344 is then transmitted to the second spatial light modulator 1326.

The first spatial light modulator 1324 corresponds to the first color-splitting part 1340 and receives light refracted from the first color-splitting part 1340. The second spatial light modulator 1326 corresponds to the second color-splitting part 1342 and receives light refracted from the second color-splitting part 1342. The first spatial light modulator 1324 and the second spatial light modulator 1326 reflect light transmitting thereon by rotating micro-mirrors mounted on a surface thereof, and then transmit the second light beam, the third light beam, and the fourth light beam to the projecting lens 10 via the total-internal-reflecting mirror 1320.

The optical projecting apparatus 12 further includes a controller 136 electrically connected to the first solid state light generator 120 and the second solid state light generator 122, so that the first solid state light generator 120 and the second solid state light generator 122 generate the first light beam and the second light beam in sequence.

Figure 3:
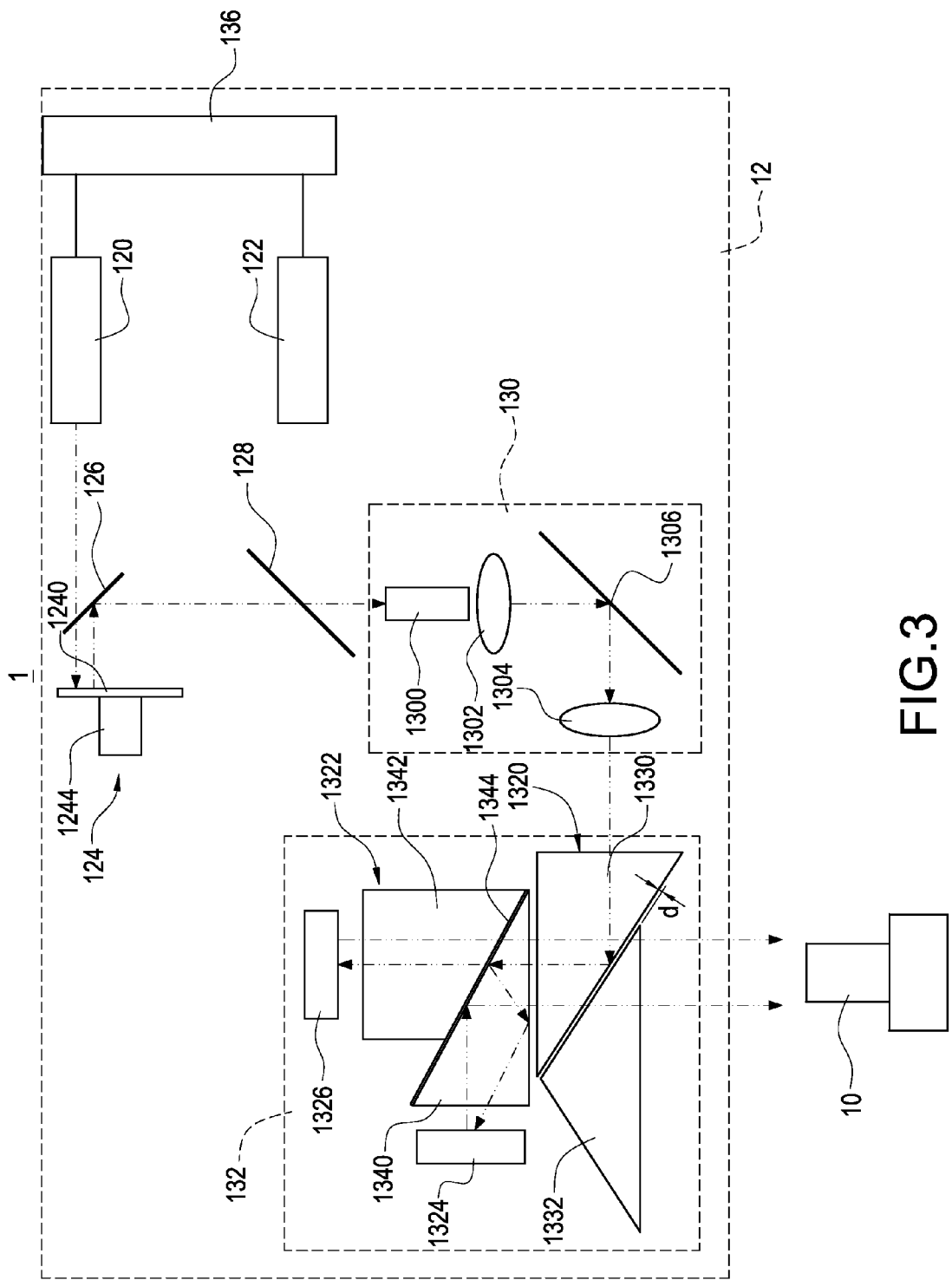
FIG. 3 is an operational diagram of the optical projecting system according to the first embodiment of the present invention.

Reference is made to FIG. 3, which is an operational diagram of the optical projecting system according to the first embodiment of the present invention. In this operation, the first solid state light generator 120 generates the first light beam. The first light beam is transmitted to the first wavelength-converting module 124 via the first color-splitting filter 126. After that, the first light beam is converted by the wavelength-converting layer 1242 to generate the wavelength-converted light beam, and the wavelength-converted light beam is then transmitted to the first color-splitting filter 126.

The wavelength (or called spectrum) of the wavelength-converted light beam is different from that of the first light beam, and the wavelength-converted light beam has the yellow spectrum. The first color-splitting filter 126 reflects the wavelength-converted light beam, and then the wavelength-converted light beam is transmitted to the second color-splitting filter 128 which passing the wavelength-converted light beam passing through. After that, the wavelength-converted light beam is transmitted to the optical module 130, and then transmitted to the spatial light modulating module 132 via the optical module 130.

The wavelength-converted light beam entering the spatial light modulating module 132 is transmitted to the total-internal-reflecting prism 1320 at first, and then transmitted to the color-splitting prism 1322. The wavelength-converted light beam entering the color-splitting prism 1322 is transmitted to the color-splitting layer 1344 via the first color-splitting part 1340. The color-splitting layer 1344 splits the wavelength-converted light into the third light beam and the fourth light beam. The fourth light beam is reflected by the color-splitting layer 1344 and transmitted to the first spatial light modulator 1324, and the third light beam passes through the color-splitting layer 1344 and is then transmitted to the second spatial light modulator 1326. In the practical applications, the third light beam and the fourth light beam are not limited to have red spectrum and green spectrum, respectively.

The micro-mirrors of the first spatial light modulator 1324 reflect the fourth light beam so that the fourth light beam enters the projecting lens 10 via the total-internal-reflecting prism 1320, and the micro-mirrors of the second spatial light modulator 1326 reflect the third light beam so that the third light beam enters the projecting lens 10 via the total-internal-reflecting prism 1320.

Accordingly, when the first solid state light generator 120 turns on, the first light beam generated thereof passes through the first wavelength-converting module 124 and the spatial light modulating module 132, and then the third light beam and the fourth light beam are generated. Namely, the projecting lens 10 receives the third light beam and the fourth light beam while the first solid state light generator 120 turns on.

Figure 4:
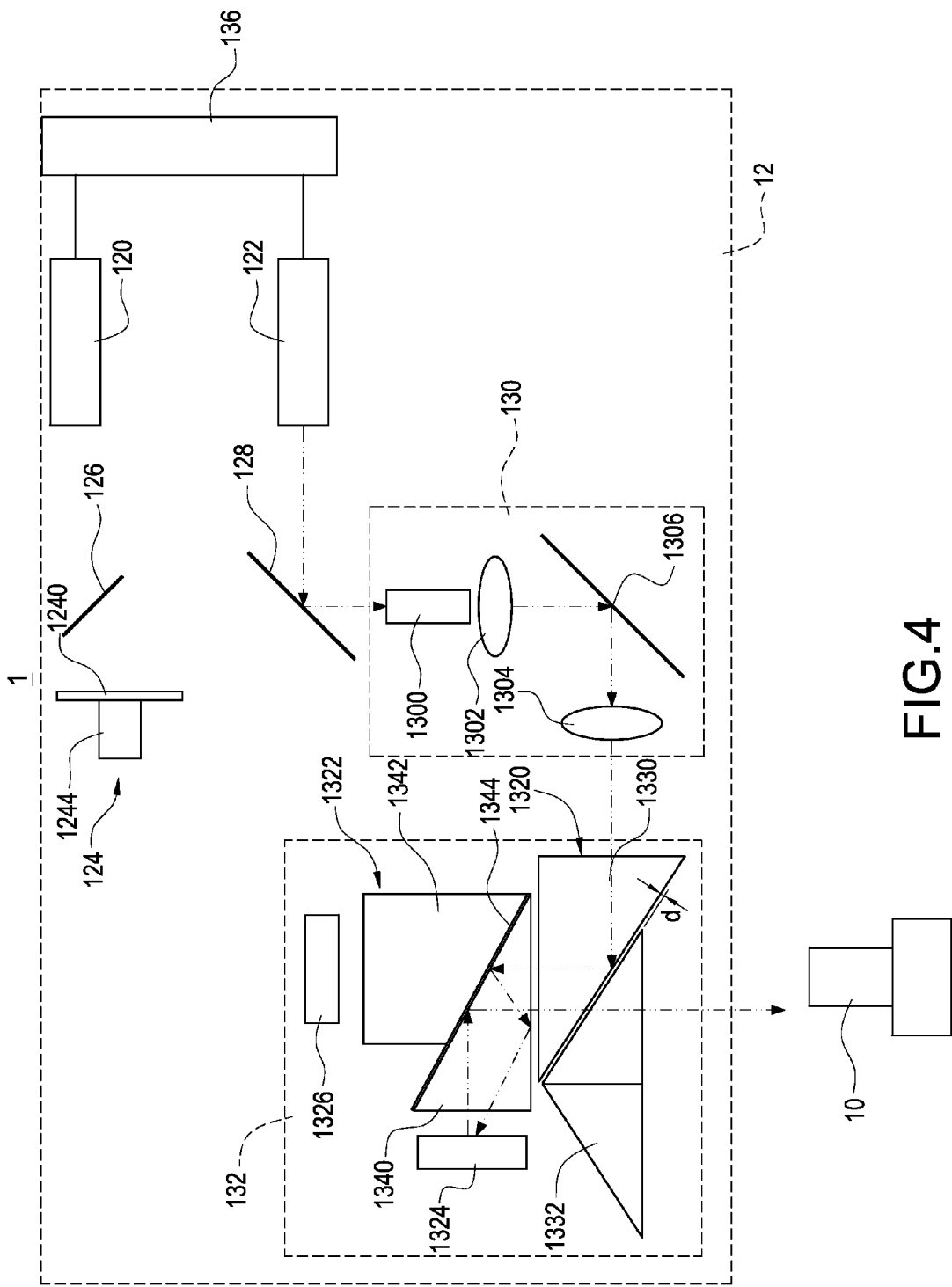
FIG. 4 is another operational diagram of the optical projecting system according to the first embodiment of the present invention.

Reference is made to FIG. 4, which is another operational diagram of the optical projecting system according to the first embodiment of the present invention. In this operation, the second solid state light generator 122 generates the second light beam. The second light beam is transmitted to the optical module 130 via the second color-splitting filter 128, and the second light beam entering the optical module 130 is then transmitted to the spatial light modulating module 132.

The second light beam entering the spatial light modulating module 132 is transmitted to the total-internal-reflecting prism 1320 at first, and then transmitted to the color-splitting prism 1322. After that, the second light beam entering the color-splitting prism 1322 is transmitted to the color-splitting layer 1344 via the first color-splitting part 1340. The first color-splitting layer 1344 reflects the second light beam and transmits the second light beam to the first spatial light modulator 1324.

The micro-mirrors mounted on the surface of the first spatial light modulator 1324 reflect the second light beam so that the second light bean enters the projecting lens 10 via the total-internal-reflecting lens 1320.

Accordingly, when the second solid state light generator 122 turns on, the second light beam is generated and transmitted to the projecting lens 10 via the first wavelength-converted module 124 and the spatial light modeling module 132 in sequence. In other words, the projecting lens 10 receives the second light beam while the second solid state light generator 122 turns on.

Through properly modulating activated times of the first solid state light generator 120 and the second solid state light generator 122, the first solid state light generator 120 and the second solid state light generator 122 can be illuminated sequence, and light beam passing through the projecting lens 10 is maintained in white balance. The controller 136 electrically connected to the first solid state light generator 120 and the second solid state light generator 122 controls activated times of the first solid state light generator 120 and the second solid state light generator, such that optical energies of the second light beam, the third light beam, and the fourth light beam can be varied. In the same time, by properly controlling the first spatial light modulator 1324 and the second spatial light modulator 1326, white balance can be achieved.

Figure 5:
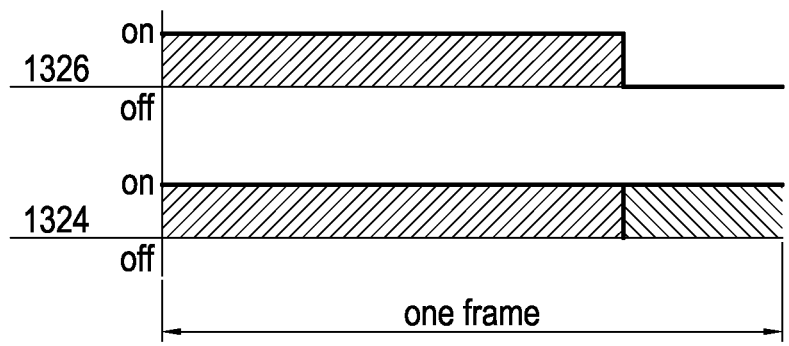
FIG. 5 shows a sequence diagram of operating a first spatial light modulator and a second spatial light modulator according to the first embodiment of the present invention.

Reference is made to FIG. 5, which shows sequence diagrams of operating the first spatial light modulator and the second spatial light modulator according to the first embodiment of the present invention. Red spectrum, green spectrum, and blue spectrum must be simultaneously projected to the screen via the projecting lens 10 if image in full-white is needed. The first solid state light generator 120, the first spatial light modulator 1324, and the second spatial light generator 1326 are activated in the same time, so that third light beam (having red spectrum) and the fourth light beam (having green spectrum) are transmitted to the screen via the projecting lens 10. When the second solid state light generator 132 is activated, the first spatial light modulator 1324 is activated, and the second spatial light modulator 1326 is inactivated, the second light beam is transmitted to the screen via the projecting lens 10. Ever if the light beams having the red spectrum, the green spectrum, and the blue spectrum are not generated in the same time, the actions of the first spatial light modulator 1324 and persistence of vision, observer can sight that the three spectrums (red, green, and blue) are simultaneously projected to the screen, and white image can be sight by the observer.

Figure 6:
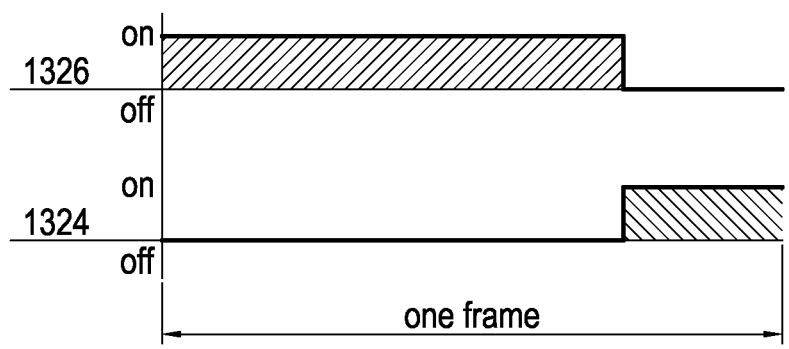
FIG. 6 shows another sequence diagram of operating the first light modulator and the second spatial light modulator according to the first embodiment of the present invention.

FIG. 6 shows another sequence diagram of operating the first light modulator and the second spatial light modulator according to the first embodiment of the present invention. Red light beam and blue light beam must be simultaneously transmitted to the screen via the projecting lens if image in purple is needed. When the first solid state light generator 120 and the first spatial light modulator 1324 are inactivated, and the second spatial light modulator 1326 is activated, the third light beam (having red spectrum) is transmitted to the screen via the projecting lens. When the second solid state light generator 122 is activated, the first spatial light modulator 1324 is activated, and the second spatial light generator 1326 is inactivated, second light beam is transmitted to the screen via the projecting lens 10. Despite the light beams having red spectrum and blue spectrum are not generated in the same time, the actions of the first spatial light modulator 1324 and the second spatial light modulator 1326 and persistence of vision, observer can sight that the two spectrums (red and blue) are simultaneously projected to the screen, and purple image can be sight by the observer.

Figure 7:
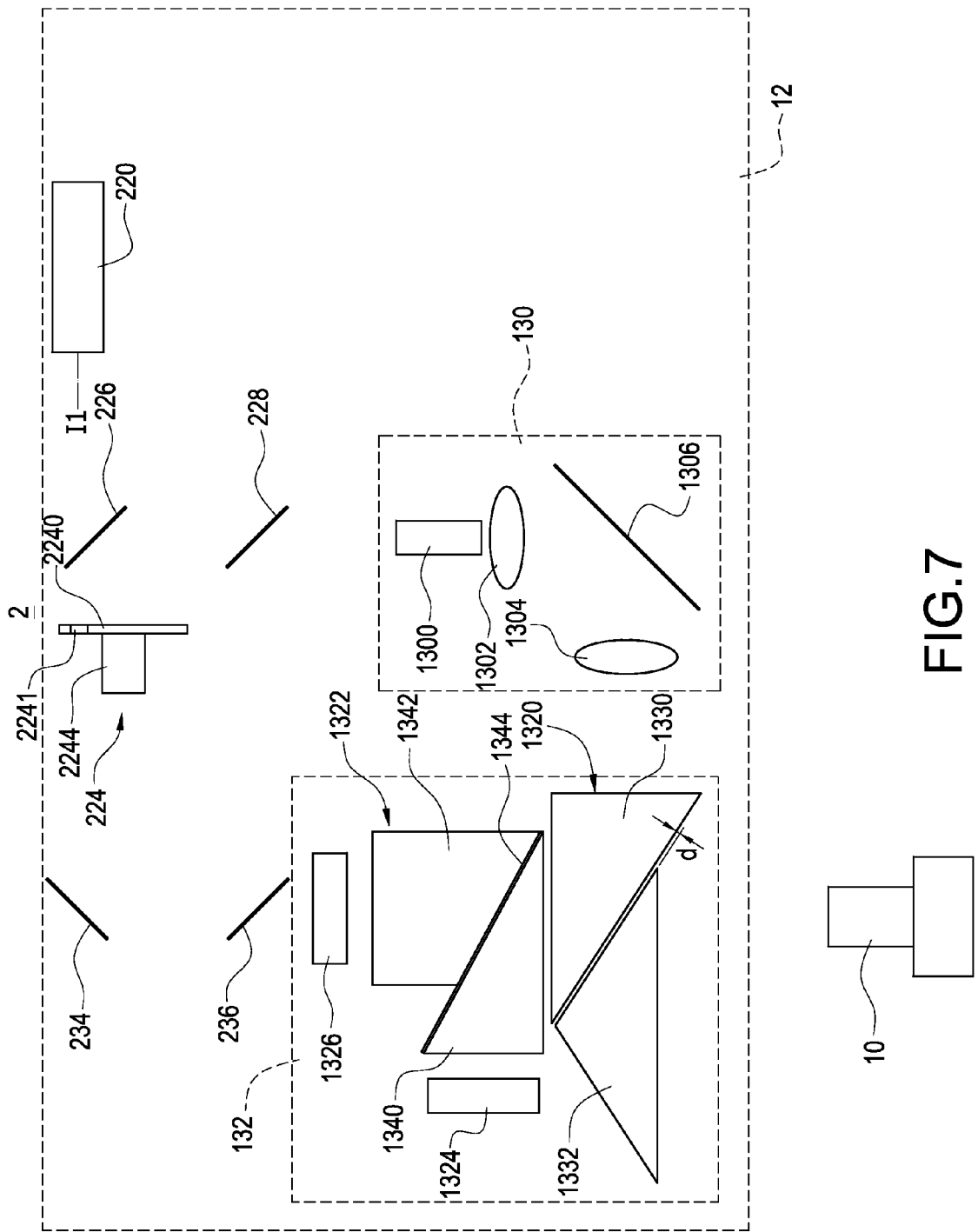
FIG. 7 is schematic diagram of an optical projecting system according to a second embodiment of the present invention.

Reference is made to FIG. 7, which is a schematic diagram of an optical projecting system according to a second embodiment of the present invention. The optical projecting system 2 includes a projecting lens 10 and an optical projecting apparatus 22. The optical projecting apparatus 22 projects a light beam to a screen (not shown) via the projecting lens 10.

The optical projecting apparatus 22 includes a solid state light generator 220, a wavelength-converting module 224, a first color filter 126, a second color filter 228, an optical module 130, a spatial light modulating module 132, a first reflector 234, and a second reflector 236.

The solid state light generator 220 having an optical axis I is configured to generate a light beam. The optical axis I is a symmetrical axis for illuminant intensity of the first light beam in spatial distribution. In this embodiment, the light beam generated from the solid state light generator 220 has a blue spectrum. In the practical applications, however, the light beam generated from the solid state light generator 220 is not limited to have blue spectrum. The solid state light generator 220 is, for example, a laser generator.

Figure 8:
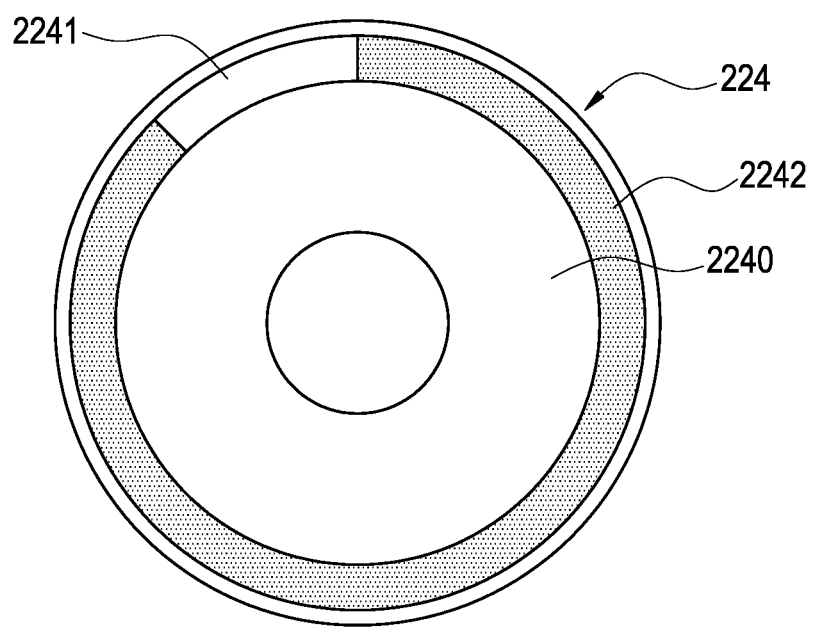
FIG. 8 is a top view of a first wavelength-converting module according to the second embodiment of the present invention.

The wavelength-converting module 224 is arranged between the solid state light generator 220 and the projecting lens 10. The wavelength-converting module 224 includes a carrying component 2240, a wavelength-converting layer 2242, and a rotating component 2244. The carrying component 2240 is, for example, made of metal or glass. In particularly, the metallic carrying component 2240 can rapidly conduct heat incurred by the first light beam. The profile of the carrying component 2240 is substantially circular ring and has an opening 2241 formed thereon, as shown on FIG. 8.

The wavelength-converting layer 2242 is coated on a surface of the carrying component 2240 and facing the solid state light generator 220. In particularly, the wavelength-converting layer 2242 and the opening 2241 collectively form a ring shape on the carrying component 2240. The light beam is converted by the wavelength-converting layer 2242 to generate a wavelength-converted light beam, and in this embodiment, the wavelength-converted light beam has a yellow spectrum. The rotating component 2244 drives the carrying component 2240 to rotate on clockwise or anti-clockwise, and the light beam generated form the solid state light generator is transmitted to the first reflector 236 when the opening 2241 is coincide with the optical axis I.

The first color-splitting filter 226 is arranged between the solid state light generator 220 and the wavelength-converting module 224. The first color-splitting filter 226 passes a light beam with a particular wavelength (or spectrum) through and reflects another light beam with another particular wavelength (or spectrum). In this embodiment, the first color-splitting filter 226 reflects the wavelength-converted light beam and passes the light beam generated from the solid state light generator 220 passing through. In this embodiment, the light beam generated by the solid state light generator 220 passes through the first color-splitting filter 226, the wavelength-converted light beam generated by the solid state light generator 220 and wavelength-converted by the wavelength-converting layer 2242 is reflected by the first color-splitting filter 226, and then the wavelength-converted light is transmitted toward the projecting lens 10.

With referred again to FIG. 7, the second color-splitting filter 228 is arranged between the first color-splitting filter 226 and the projecting lens 10, and located within a transmitting route of the wavelength-converted light beam. The second color-splitting filter 228 passes a light beam having particular wavelength through and reflects another light beam having another wavelength. In this embodiment, the second color-splitting filter 228 reflects the light beam generated from the solid state light generator 220 and passes the wavelength-converted light beam through. Accordingly, the light beam generated by the solid state light generator 220 and passes through the opening 2241, the first reflector 234, and the second reflector 236 is reflected by the second color-splitting filter 228, and the wavelength-converted light beam passes through the second color-splitting filter 228. The first reflector 236 is arranged behind the wavelength-converting module 224 and facing the solid state light generator 220 for reflecting light beam generated by the solid state light generator 220 and passing through the opening 2241. The second reflector 238 is arranged between the first reflector 236 and the second color-splitting filter 228 for reflecting light beam reflected by the first reflector 236 to the second color-splitting filter 228.

The optical module 130 is arranged between the second color-splitting filter 228 and the projecting lens 10. The optical module 130 includes a light passageway component 1300, a first lens 1302, a second lens 1304, and a mirror 1306. The light passageway component 1300 is close to the second color-splitting filter 228 and can be light-guide tube or rod lens.

The first lens 1302 is arranged between the light passageway component 1300 and the projecting lens 10. The second lens 1304 is arranged between the first lens 1302 and the projecting lens 10. The mirror 1306 is arranged between the first lens 1302 and the second lens 1304. The optical module 130 transmits the wavelength-converted light beam generated by the solid state light generator 220 and wavelength-converted by the wavelength-converting module 224 to the spatial light modulating module 132.

The spatial light modulating module 132 is arranged between the optical module 130 and the projecting lens 10. The spatial light modulating module 132 includes a total-internal-reflecting prism 1320, a color-splitting prism 1322, a first spatial light modulator 1324, and a second spatial light modulator 1326.

The total-internal-reflecting prism 1320 total-internal-reflects the wavelength-converted light beam and the light beam generated from the solid state light generator 220 so that the wavelength-converted light beam and the light beam generated from the solid state light generator 220 are transmitted to the color-splitting prism 1322.

Figure 9:
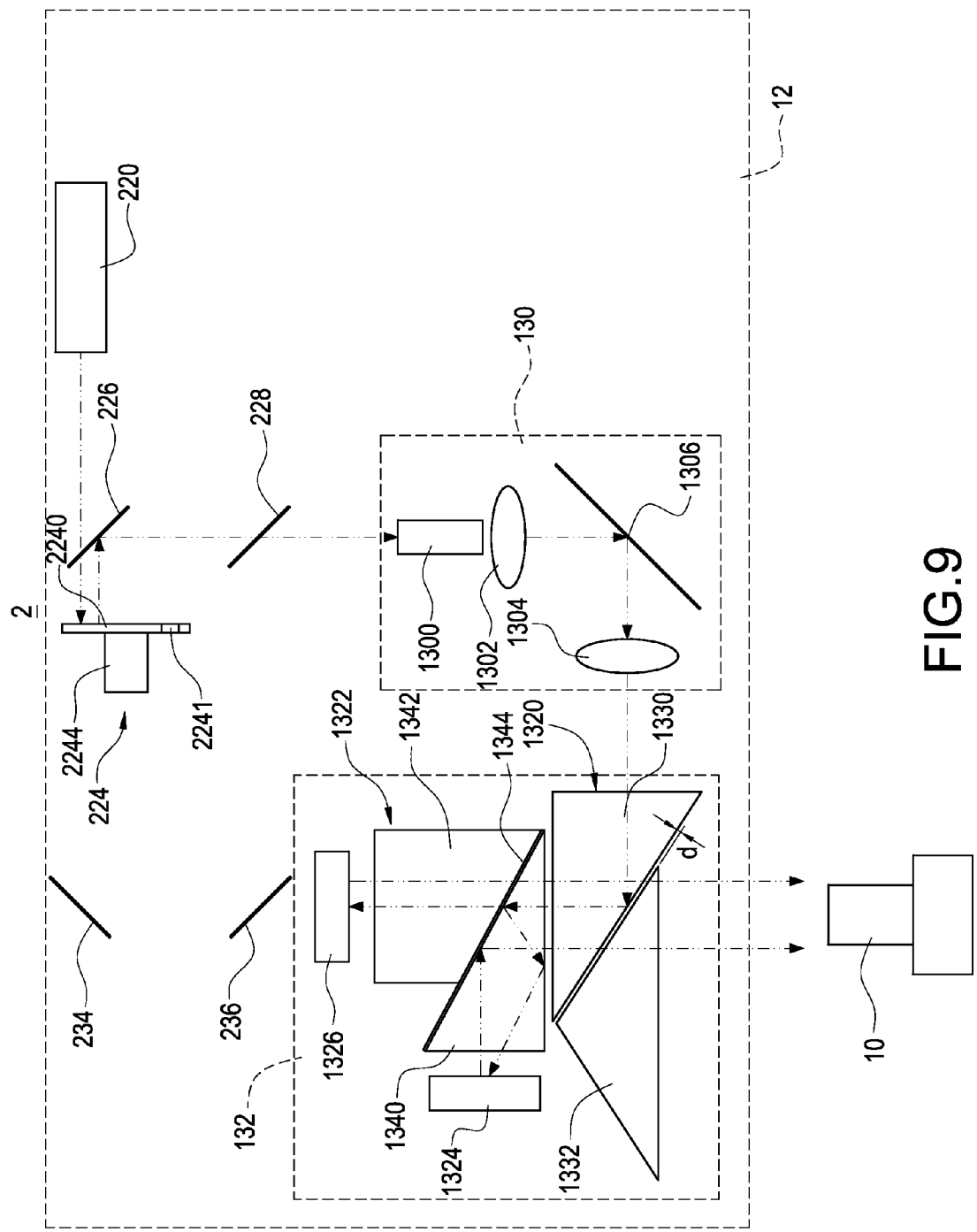
FIG. 9 is an operational diagram of the optical projecting system according to the second embodiment of the present invention.

The color-splitting prism 1322 includes a first color-splitting part 1340, a second color-splitting part 1342, and a color-splitting layer 1344. The first color-splitting part 1340 is close to the total-internal-reflecting prism 1320, the second color-splitting part 1342 is far away from the total-internal-reflecting prism 1320. The color-splitting layer 1344 is arranged between the first color-splitting part 1340 and the second color-splitting part 1342, and splits the wavelength-converted light beam into a first light beam and a second light beam (as shown in FIG. 9). The color-splitting layer 1344 passes the first light beam having red spectrum through and reflects the second light beam having green spectrum. The second light beam reflected by the color-splitting layer 1344 is transmitted to the first spatial light modulator 1324, and the first light beam passing through the color-splitting layer 1344 is then transmitted to the second spatial light modulator 1326.

Figure 10:
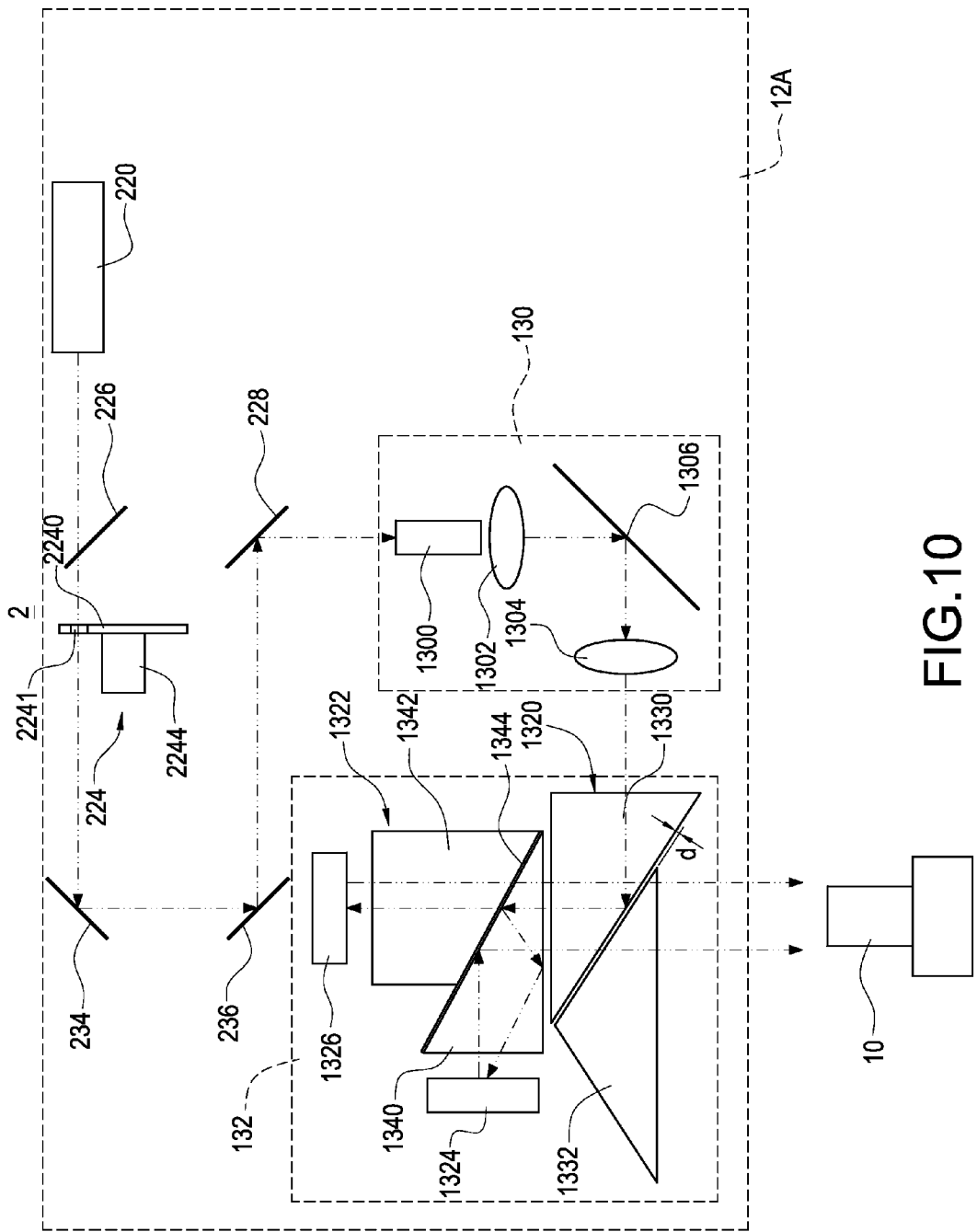
FIG. 10 is another operational diagram of the optical projecting system according to the second embodiment of the present invention.

The first spatial light modulator 1324 corresponds to the first color-splitting part 1340 and receives light refracted from the first color-splitting part 1340. The second spatial light modulator 1326 corresponds to the second color-splitting part 1342 and receives light refracted from the second color-splitting part 1342. The first spatial light modulator 1324 and the second spatial light modulator 1326 reflect light transmitting thereon by rotating micro-mirrors mounted on a surface thereof, and then transmit the light beam generated from the solid state light generator 220 (the transmitting route of the light beam generated from the solid state light generator is shown in FIG. 10), the first light beam, and the second light beam to the projecting lens 10 via the total-internal-reflecting mirror 1320.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An optical projecting apparatus used for projecting a light beam to a screen via a projecting lens, the optical projecting apparatus and the projecting lens collectively forming an optical projecting system, the optical projecting apparatus comprising:
   a first solid state light generator generating a first light beam;
   a second solid state light generator generating a second light beam;
   an optical module arranged between the first solid state light generator, the second solid state light generator, and the projecting lens;
   a first wavelength-converting module arranged between the first solid state light generator and the optical module, wherein the first light beam is converted by the first wavelength-converting module to generate a wavelength-converted light beam;
   a first color-splitting filter reflecting the wavelength-converted light and passing the first light beam through;
   a second color-splitting filter reflecting the second light beam and passing the wavelength-converted light beam through, and
   a spatial light modulating module arranged between the optical module and the projecting lens, the spatial light modulating module splitting the wavelength-converted light into a third light beam and a fourth light beam, and transmitting the second light beam, the third light beam, and the fourth light beam to the screen via the projecting lens.

2. The optical projecting apparatus in claim 1, further comprising a controller electrically connected to the first solid state light generator and the second solid state light generator, the controller is configured to alternatively illuminant the first solid state light generator and the second solid state light generator.

3. The optical projecting apparatus in claim 1, wherein the optical system comprises:
   a light passageway component;
   a mirror arranged between the light passageway component and the spatial light modulating module;

a first lens arranged between the light-passageway component and the mirror, and a second lens arranged between the mirror and the spatial light modulating module.

4. The optical projecting apparatus in claim 1, wherein the spatial light modulating module comprises:

a color-splitting prism splitting the wavelength-converted light into the third light beam and the fourth light beam;

a total-internal-reflecting prism arranged near the optical module for receiving the wavelength-converted light beam and the second light beam passing through the optical module, and transmitting the wavelength-converted light beam and the second light beam to the color-splitting prism;

a first spatial light modulator receiving and reflecting the second light beam and the third light beam, and a second spatial light modulator receiving and reflecting the fourth light beam.

5. The optical projecting apparatus in claim 1, wherein the first wavelength-converted module comprising:

a carrying component;

a wavelength-converting layer partially covering the carrying component, and a rotating component connected to the carrying component.

6. The optical projecting apparatus in claim 1, wherein the first light beam has a blue spectrum, the second light beam has the blue spectrum, the third light beam has a green spectrum, and the wavelength-converted light beam has a yellow spectrum.

7. The optical projecting apparatus in claim 1, wherein the first solid state light generator and the second solid state light generator are respectively a laser generator.

8. The optical projecting apparatus in claim 1, wherein the first color-splitting filter arranged between the first solid state light generator and the first wavelength-converting module, and the second color-splitting filter arranged between the second solid state light generator and the optical module.

9. An optical projecting apparatus used for projecting a light beam to a screen via a projecting lens, the optical projecting apparatus and the projecting lens collectively forming an optical projecting system, the optical projecting apparatus comprising:

a solid state light generator generating a light beam;

an optical module arranged between the solid state light generator and the projecting lens;

a wavelength-converting module arranged between the solid state light generator and the optical module, wherein the light beam generated from the solid state light generator is converted by the wavelength-converting module to generate a wavelength-converted light beam, the wavelength-converting module comprising:

a carrying component having an opening;

a wavelength-converting layer partially covering the carrying component; and a rotating component connected to the carrying component;

a first color-splitting filter reflecting the wavelength-converted light and passing the light beam generated from the solid state light generator through;

a second color-splitting filter reflecting the light beam generated from the solid state light generator and passing the wavelength-converted light beam through;

a first reflector arranged behind the wavelength-converting module;

a second reflector arranged between the first reflector and the second color-splitting filter; and a spatial light modulating module arranged between the optical module and the projecting lens, the spatial light modulating module splitting the wavelength-converted light into a first light beam and a second light beam, and transmitting the light beam generated from the solid state light generator, the first light beam, and the second light beam to the screen via the projecting lens.

10. The optical projecting apparatus in claim 9, wherein the opening and the wavelength-converting layer collective form a ring shape.

11. The optical projecting apparatus in claim 9, wherein the optical system comprises:

a light passageway component;

a mirror arranged between the light passageway component and the spatial light modulating module;

a first lens arranged between the light-passageway component and the mirror; and a second lens arranged between the mirror and the spatial light modulating module.

12. The optical projecting apparatus in claim 9, wherein the spatial light modulating module comprises:

a color-splitting prism splitting the wavelength-converted light into the third light beam and the fourth light beam;

a total-internal-reflecting prism arranged near the optical module for receiving the wavelength-converted light beam and the light beam generated from the solid state light generator passing through the optical module, and transmitting the wavelength-converted light beam and the light beam generated from the solid state light generator to the color-splitting prism;

a first spatial light modulator receiving and reflecting the light beam generated form the solid state light generator and the third light beam, and a second spatial light modulator receiving and reflecting the fourth light beam.

13. The optical projecting apparatus in claim 9, wherein the light beam generated from the solid state light generator has a blue spectrum, the third light beam has a green spectrum, and the wavelength-converted light beam has a yellow spectrum.

14. The optical projecting apparatus in claim 9, wherein the solid state light generator is a laser generator.

15. The optical projecting apparatus in claim 9, wherein the first color-splitting filter arranged between the solid state light generator and the wavelength-converting module, and the second color-splitting filter arranged between the first color-splitting filter and the optical module.

* * * * *